United States Patent [19]

Maney et al.

[11] Patent Number: 5,097,421
[45] Date of Patent: Mar. 17, 1992

[54] INTELLIGENT WAFER CARRIER

[75] Inventors: George A. Maney, Sunnyvale; Anthony C. Bonora, Menlo Park; Mihir Parikh, San Jose; Michael D. Brain, Oakland, all of Calif.

[73] Assignee: Asyst Technologies, Inc., Milpitas, Calif.

[21] Appl. No.: 54,212

[22] Filed: May 18, 1987

Related U.S. Application Data

[63] Continuation-in-part of Ser. No. 686,444, Dec. 24, 1984, abandoned.

[51] Int. Cl.$^5$ ............................................. G06F 15/46
[52] U.S. Cl. ........................................ 364/478; 235/375; 364/468
[58] Field of Search .................. 364/468, 478, 424.01, 364/424.02; 235/375, 376, 492; 414/331, 273, 274, 403, 410, 416, 417, 217; 340/825.3, 825.31; 104/88; 198/341, 349, 349.5–349.95, 356, 358

[56] References Cited

U.S. PATENT DOCUMENTS

| | | | |
|---|---|---|---|
| 3,796,327 | 3/1974 | Meyer et al. | 414/273 |
| 4,237,598 | 12/1980 | Williamson | 364/478 |
| 4,328,545 | 5/1982 | Halsall et al. | 364/424.02 |
| 4,415,065 | 11/1983 | Sandstedt | 235/383 |
| 4,428,708 | 1/1984 | Burt | 364/478 |
| 4,490,798 | 12/1984 | Franks et al. | 364/478 |
| 4,492,504 | 1/1985 | Hainsworth | 414/273 |
| 4,514,815 | 4/1985 | Anderson | 364/478 |
| 4,532,970 | 8/1985 | Tullis et al. | 414/217 X |
| 4,545,106 | 10/1985 | Juengel | 901/6 |
| 4,554,955 | 11/1985 | von Lersner et al. | 364/478 X |
| 4,575,621 | 3/1986 | Dreifus | 235/492 |
| 4,588,880 | 5/1986 | Hesser | 235/492 |
| 4,641,245 | 2/1987 | Dziggel | 364/478 |
| 4,646,245 | 2/1987 | Prodel et al. | 364/468 |
| 4,654,512 | 3/1987 | Gardosi | 364/468 X |
| 4,669,047 | 5/1987 | Chucta | 364/478 X |
| 4,821,198 | 4/1989 | Takguchi et al. | 364/468 |

FOREIGN PATENT DOCUMENTS 2022894 12/1979 United Kingdom ................ 364/478

OTHER PUBLICATIONS

"IDX Press Release"–Allen Bradley Co.; Western Operations, Santa Cruz, California.
Identronix Read Write Systems manual.

Primary Examiner—Joseph Ruggiero
Attorney, Agent, or Firm—Fliesler, Dubb, Meyer & Lovejoy

[57] ABSTRACT

Disclosed is a system mounted with a transportable container for carrying articles such as semiconductor wafers which comprises a non-volatile memory used to store the identity, status and history of the articles in the container. Further, the system includes means for transmitting data from the memory to an information processor associated with a processing station which processes the articles in a carrier. In a preferred embodiment, the system includes data processing capability and both receives data from and transmits data to the processing station.

18 Claims, 10 Drawing Sheets

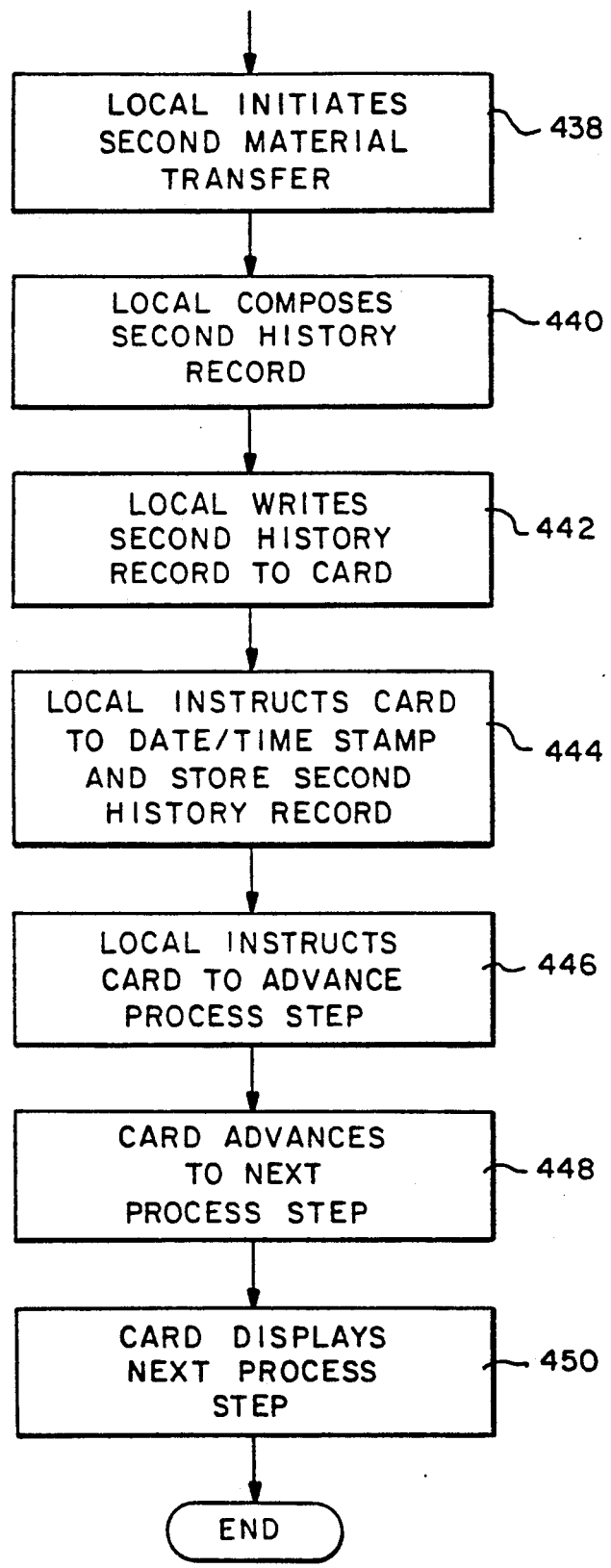
FIG.—9C

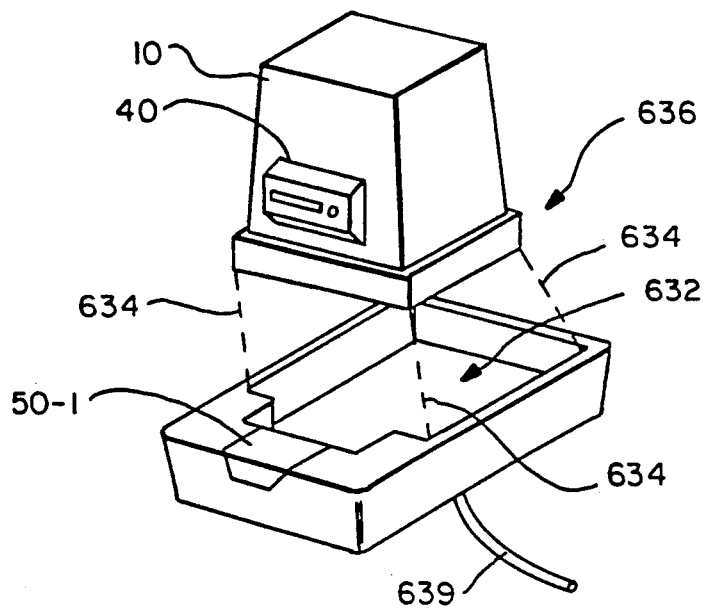
FIG. —12
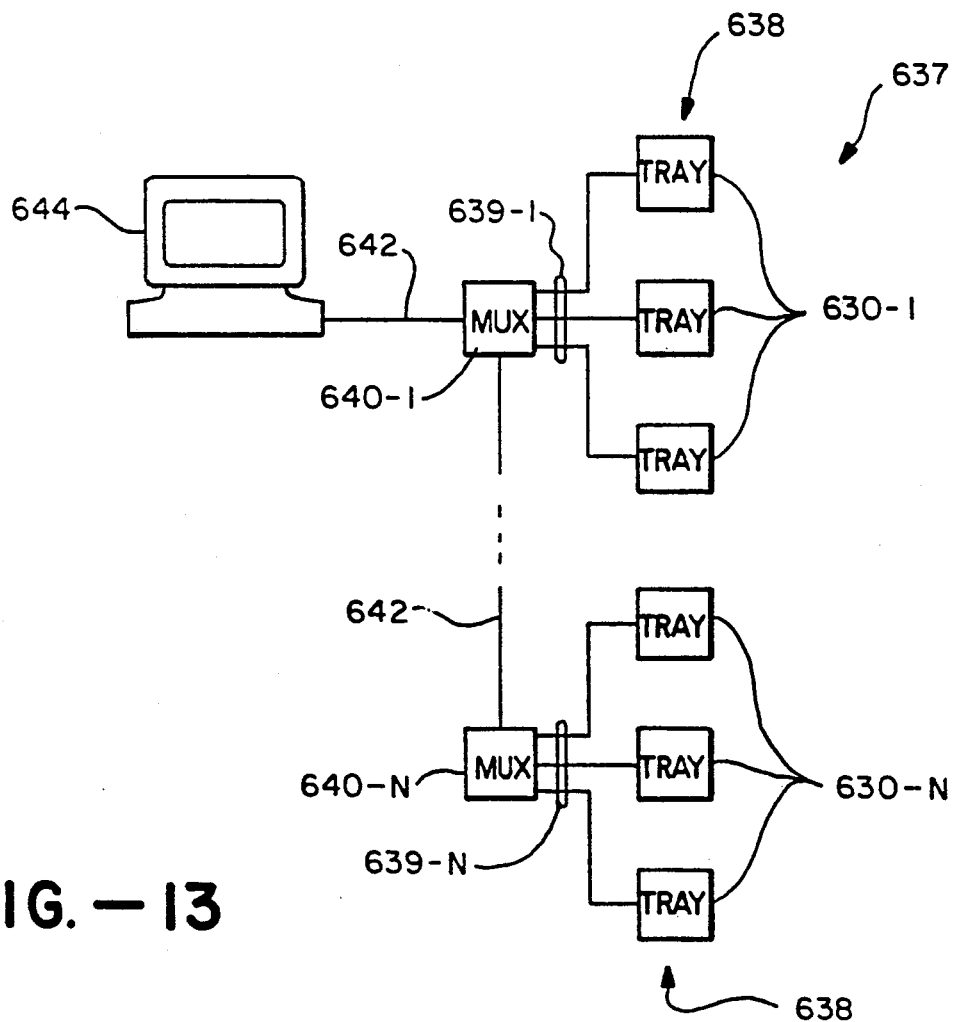
FIG. —13

INTELLIGENT WAFER CARRIER

This is a continuation-in-part of Ser. No. 686,444, filed Dec. 24, 1984, now abandoned.

FIELD OF THE INVENTION

The present invention relates to standardized mechanical interface systems for reducing particle contamination of semiconductor wafers during semiconductor processing. More particularly, the present invention relates to an apparatus for information processing in standard mechanical interface systems.

BACKGROUND OF THE INVENTION

A standardized mechanical interface (SMIF) system has been proposed to reduce particle contamination by significantly reducing particle fluxes onto wafers. This end is accomplished by mechanically insuring that during transport, storage and processing of the wafers, the gaseous media (such as air or nitrogen) surrounding the wafers is essentially stationary relative to the wafers and by insuring that particles from the outside environment do not enter the immediate internal wafer environment.

The SMIF concept is based on the realization that a small volume of still, particle free air, with no internal source of particles, is the cleanest possible environment for wafers. Further details of one proposed system are described in the article "SMIF: A Technology for Wafer Cassette Transfer and VLSI Manufacturing", by Mihir Parikh and Ulrich Kaemph, *Solid State Technology*, July 1984, pp. 111-115, and the above cross-referenced applications.

The proposed SMIF system has three main components, namely, (1) minimum volume, dust proof transportable containers or boxes are used for storing and transporting wafer cassettes; (2) canopies are placed over the cassette ports of processing equipment so that the environments inside the boxes and the canopies become miniature clean spaces; and (3) doors on the boxes are designed to mate with doors on the interface ports on the equipment canopies and two doors are open simultaneously so that particles which may have been on the external door surfaces are trapped (sandwiched) between the doors In the proposed SMIF system, a box is placed at the interface port on top of the canopy at a desired processing station; latches release the boxed door and the interface port door simultaneously A mechanical elevator lowers the two doors with the cassette riding on top into the canopy covered space. A manipulator picks up the cassette and places into the cassette port/elevator of the equipment. After processing, the reverse operation takes place.

In typical processing environments today, "clean rooms" are established in which through filtering and other techniques attempts are made to remove particles which may cause contamination on semiconductor wafer surfaces. The SMIF concept is one way which has come under consideration for improving the processing environment over that available in clean rooms.

The proposed SMIF systems involve transporting cassettes of wafers from processing station to processing station inside the boxes. A given processing station may be located long distances from the preceding station. Further, the processing may be complex, involving a large number of steps different processing times, requiring the boxes including wafer cassettes to be stored between processing stations. Thus there is a need to identify the boxes containing wafers so that information about the wafers within the boxes can be processed.

The proposed SMIF systems, however, have not been fully satisfactory. The SMIF systems which have been proposed include boxes which may be marked with "OCR" or bar codes. This sort of proposed marking will identify the particular box, however, the user is unable to effectively include information with the box concerning the wafers within the box. Accordingly, there is a need for improved apparatus for information processing in SMIF systems.

SUMMARY OF THE INVENTION

The present invention is an apparatus for transporting articles such as semiconductor wafers, to be processed from one processing station to another. The apparatus includes a transportable container for the articles. A storage means is mounted on the transportable container for storing machine readable data. On the processing station, there is a means for engaging the transportable container so that the articles within the container can be withdrawn from the container into the processing environment. Adjacent the engaging means, a communicating means for reading the machine readable data from the storage means or transportable container is mounted.

In another aspect, the apparatus of the present invention includes a data processing means for processing data mounted on the transportable container. Further, a means for transmitting data from the processing station is added for communication with the data processing means on the transportable container. In this embodiment, a means for receiving data on the transportable container is included.

The invention also provides a power supply mounted with the transportable container. The power supply may include a battery or a transformer coupled circuit which receives power from a transformer mounted adjacent the engaging means, or a combination of both.

A keyboard and a display are included in one aspect of the invention with the transportable container or on the processing station so that an operator can communicate with the apparatus. Also, the transportable container may include sensors for indicating conditions, such as engagement or disengagement of the container with the engaging means, whether a cassette of wafers is within the container or not, whether the container is in its opened or closed condition, and other conditions which may be relevant to the particular processing sequence being conducted.

BRIEF DESCRIPTION OF THE DRAWINGS

FIGS. 9A, 9B, and 9C constitute a flow chart used in the explanation of the processing system in accordance with the present invention.

FIG. 12 is a perspective view of a tray and transportable container of the inventory management system in accordance with the present invention.

FIG. 13 is a block diagram of an inventory management system in accordance with the invention.

DETAILED DESCRIPTION

With reference to the drawings, a detailed description of the present invention is provided.

Figure 1:
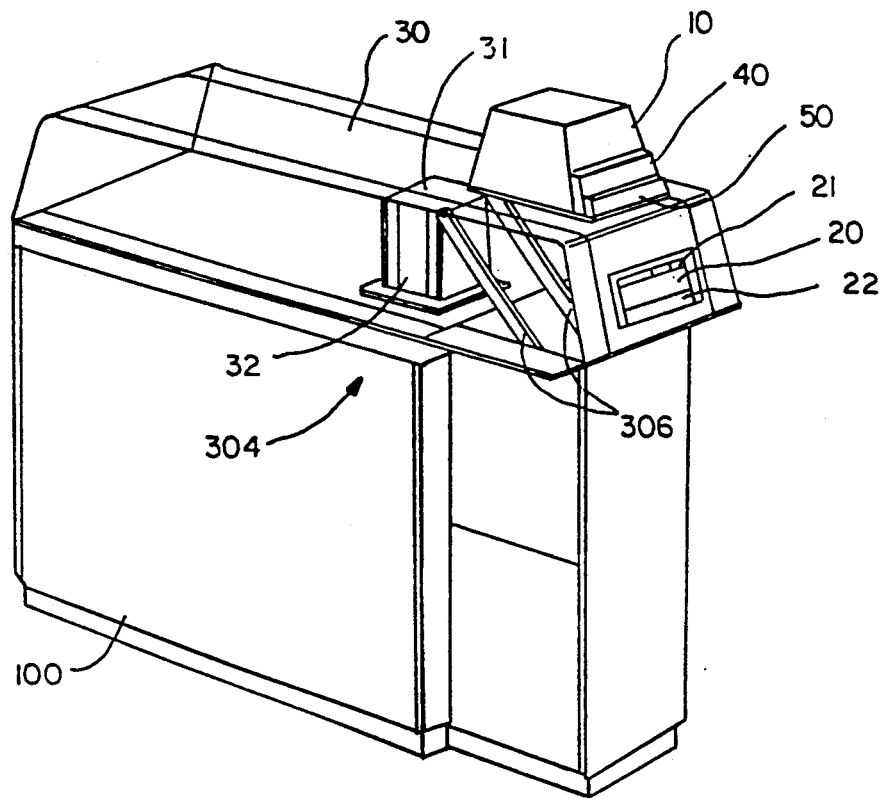
FIG. 1 shows a perspective view of a SMIF system positioned adjacent processing equipment.

In FIG. 1, a semiconductor wafer processing station 100 is shown. A given semiconductor manufacturing process may include any number of processing stations such as the station 100 shown in FIG. 1. The stations are manufactured to handle processing steps such as the application of photo resist materials, the alignment of masks for exposing photo resist materials, the deposition of materials on semiconductor wafers, and so forth.

FIG. 1 shows a transportable container 10 for semiconductor wafers, or other articles to be processed, mounted on the processing station 100. The transportable container 10 is removeably engaged on the canopy 30 of the processing station 100 by a means 60 for engaging described with reference to FIG. 2.

The transportable container 10 is adapted for containing a cartridge 31 for holding a plurality of semiconductor wafers 32. The cartridge 31 is lowered into the processing station 100 without exposure to outside air.

According to the present invention, an intelligent data card 40 is mounted on the transportable container 10. The term "data card" as used herein refers to the portion of the present invention mounted on the transportable container 10, and at a minimum includes data storage means as described below. Further, mounted on the processing station 100 is a means 50 for communication with an electronic card 40 on a transportable container 10 engaged on the processing station 100. The means 50 for communicating with the data card 40 is connected to a data processor 20 on the processing station 100. The data processor 20 may include a display 21 such as an LED or liquid crystal display. Also, the data processor 20 may include a keyboard 22 for inputting data regarding for instance the control of the process.

In operation, an operator will carrier the transportable container 10 from a first processing station 100 to a second processing station 100 with the data card 40 attached to the container 10. The data stored in the data card 40 is communicated to the means 50 on the processing station 100 for communicating with the data card 40 when the transportable container 10 is engaged. The data from the data card 40 on the transportable container 10 is communicated through the means 50 to the data processor 20. In preferred embodiments as described below in more detail, the data processor 20 may also communicate to the data card 40 through the means 50.

Figure 2:
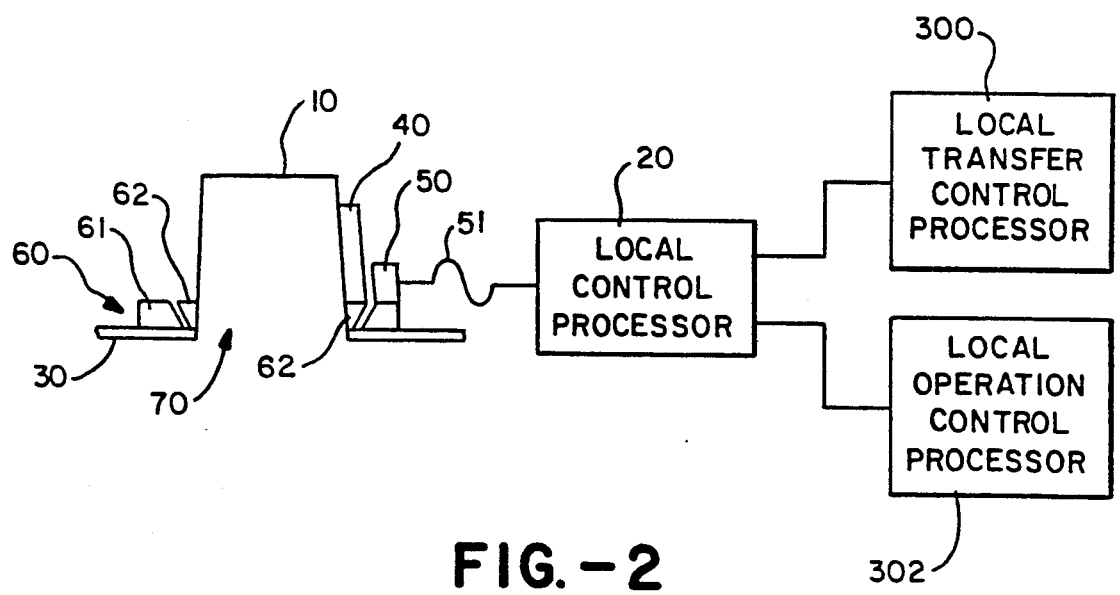
FIG. 2 is a schematic representation of a SMIF system employing the present invention.

FIG. 2 illustrates schematically the transportable container 10 engaged on the canopy 30 of a processing station. An engaging means 60 for engaging the transportable container 10 on the canopy 30 of the processing station is shown. The engaging means 60 includes a guide 61 on the canopy. Also, a tab 62 is formed on the transportable container 10. When the transportable container 10 is mounted on the guide 61 and fully engaged, the port 70 on the canopy 30 through which the cartridge of semiconductor wafers is lowered, is aligned with the transportable container 10. The data card 40 is mounted on the transportable container 10 along at least one side of the transportable container 10. The communicating means 50 is mounted adjacent the engaging means 60 in relationship with the card 40. The communicating means 50 is connected over communicating line 51 to the process controller 20 on the processing station 100.

Figure 3A:
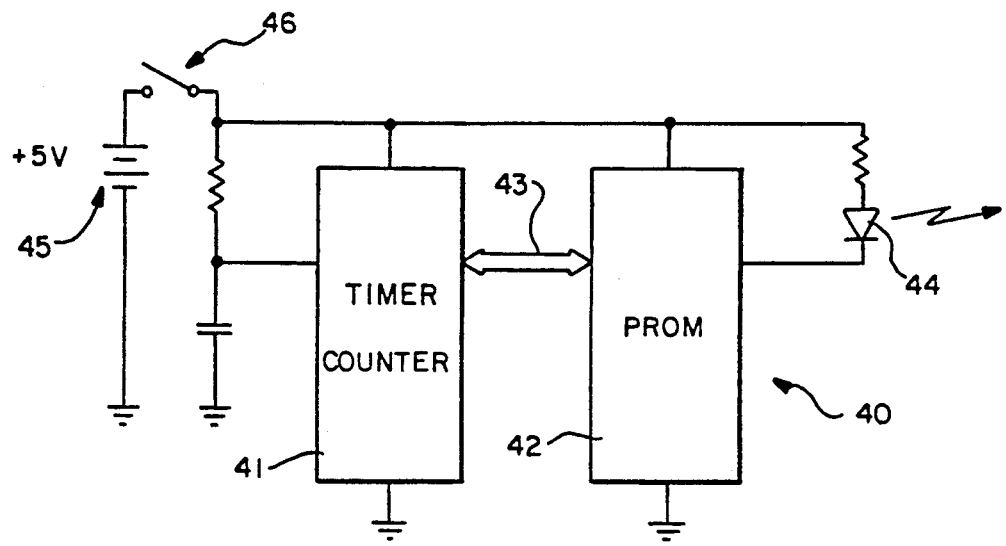
FIG. 3A and 3B are circuit diagrams of one embodiment of the present invention.
Figure 3B:
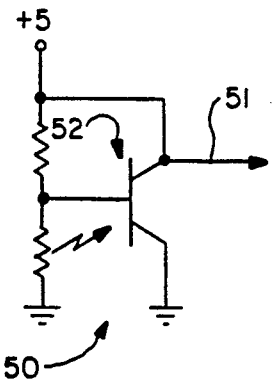

FIG. 3A illustrates a circuit for mounting on the data card 40 in one embodiment of the present invention. FIG. 3B illustrates a communication means 50 for receiving data from the card 40 as shown in FIG. 3A. The circuit of FIG. 3A includes a timer/counter 41 and a storage means 42 such as a "PROM" or other stable storage device. The timer/counter 41 is connected to the storage means 42 across a communication bus 43. The timer/counter, when power is applied, generates addresses in sequence to the storage means 41 which outputs data through the light emitting diode 44 or other optical transmission means. In the embodiment of FIG. 3A, there is a single light emitting diode mounted on the data card 40. In this manner the timer/counter sequences through data locations in the storage means 41 and causes data to be output serially through the light emitting diode 44.

The communicating means 50 of FIG. 3B includes a photosensitive transistor 52 or other photo detector which responds to the data transmitted by the light emitting diode 44 to generate a signal across the control line 51 for communication with process control on the processing station 100. When the transportable container 10 is engaged on the engaging means 60 as shown in FIG. 2, the light emitting diode 44 and the photosensitive transistor 52 are aligned for optimum communication.

The data card 40 includes a power supply 45, such as a battery. The power supply will be applied to the timer/counter by a switch 46 which is engaged only when the transportable container 10 is fully engaged on the engaging means 60.

Figure 4:
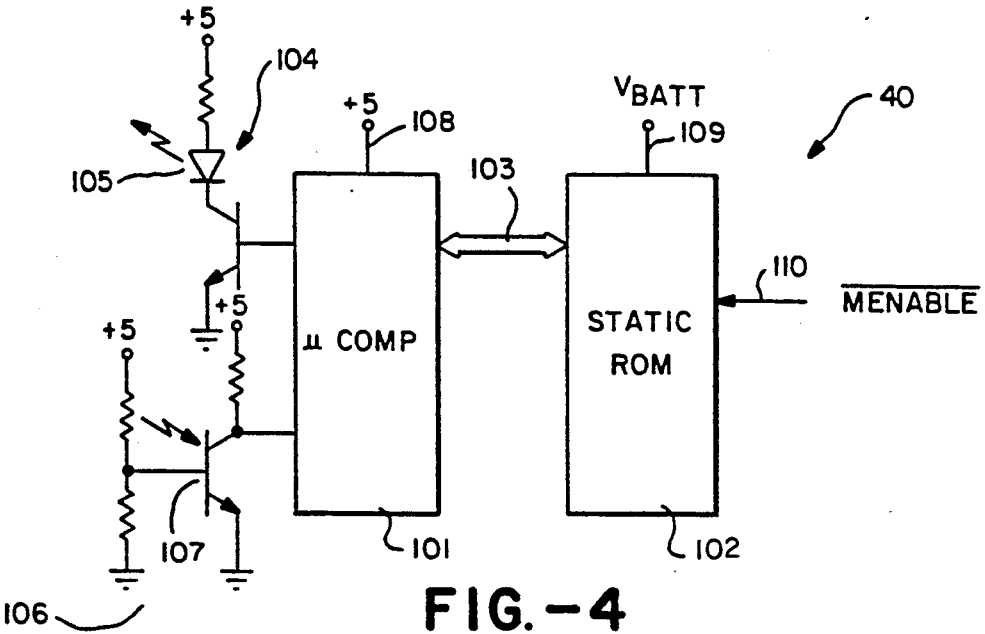
FIG. 4 is an alternative embodiment of an apparatus according to the present invention.

An alternative embodiment for a circuit on the data card 40 is shown in FIG. 4. The embodiment of FIG. 4 includes a microcomputer 101 or other data processing means and a static memory device such as a RAM 102. The microcomputer 101 communicates with the memory device 102 across the bus 103. The microcomputer 101 communicates with a transmitter 104 such as the light emitting diode 105. Also, the microcomputer 101 communicates with a receiver 106 such as the photosensitive transistor 107. The microcomputer receives power from power supply (described below) at +5 volts along line 108. The memory device 102 receives power from a battery along line 109. The storage device 102 likewise receives an enable signal on line 110 when the power supply supplying power to the microcomputer 101 is in operation.

Figure 5:
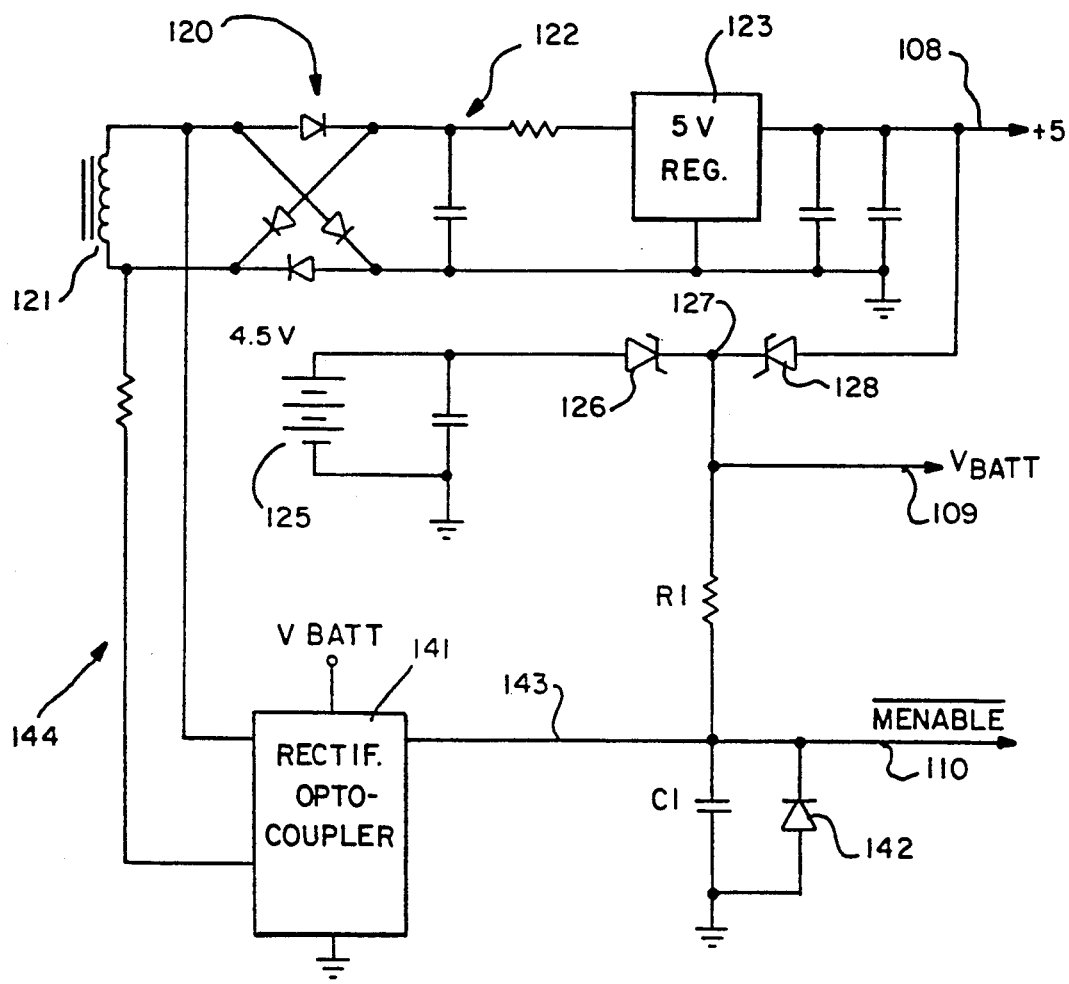
FIG. 5 is a schematic diagram of a power supply according to the present invention.

The generation of the power supply voltage on line 108, the battery voltage on line 109 and the enable signal on line 110 is accomplished by the circuit shown in FIG. 5.

FIG. 5 shows a power supply 120 for mounting on the data card 40 used in conjunction with the circuit shown in FIG. 4. The power supply 120 is adapted to receive power through a transformer coupling device 121, when the transportable container 10 is engaged by the engaging means 60 on the processing station 100. The relationship of the transformer coupling is described in more detail with reference to FIG. 6. An AC signal is received from transformer coupling means 121 and converted to DC in an AD to DC converter 122, such as the bridge shown in FIG. 5. A voltage regulator 123 may be included to provide a stable voltage for the operation of the components on the data card 40. The output of the voltage regulator 123 is supplied as the power supply voltage to the microcomputer 101 across line 108 in the embodiment of FIG. 4. On the data card 40, a battery 125 is included. The battery voltage is slightly less than the output of the voltage regulator 123 on line 108. It is connected through the Shottley diode 126 to the node 127 which is likewise connect through a Shottley diode 128 to the power supply output on line 108. Node 127 is supplied as the battery voltage to the storage device 102 on line 109.

The memory enable signal (MENABLE) operates to enable the memory device 102 only when the power from the transformer coupled power 121 is turned on. For the embodiment shown in FIG. 5 including the rectifying optocoupler 141 and the circuit including R1 and C1 and the diode 142, the memory enable circuit is generated as it will be described with reference to FIG. 8.

The rectifying optocoupler 141 is a means for generating voltage on line 143 from the power supply such as battery 125 when the power from the transformer coupling device is off. When the power from the transformer coupling device turns on as indicated by line 200 of FIG. 8 at point 201, output on line 143 tends to drop which can be seen at point 301 of line 300 on FIG. 8. However, the speed at which the voltage on line 143, MENABLE can drop as determined by the time constant set by R1 and C1. Thus, the power on line 108 will reach the voltage necessary to drive the microcomputer 101 before the enable signal on line 110 reaches a level to enable the memory device 102. This prevents causing disruption of the data stored in the memory device before the power is completely up in the data card 40.

Figure 8:
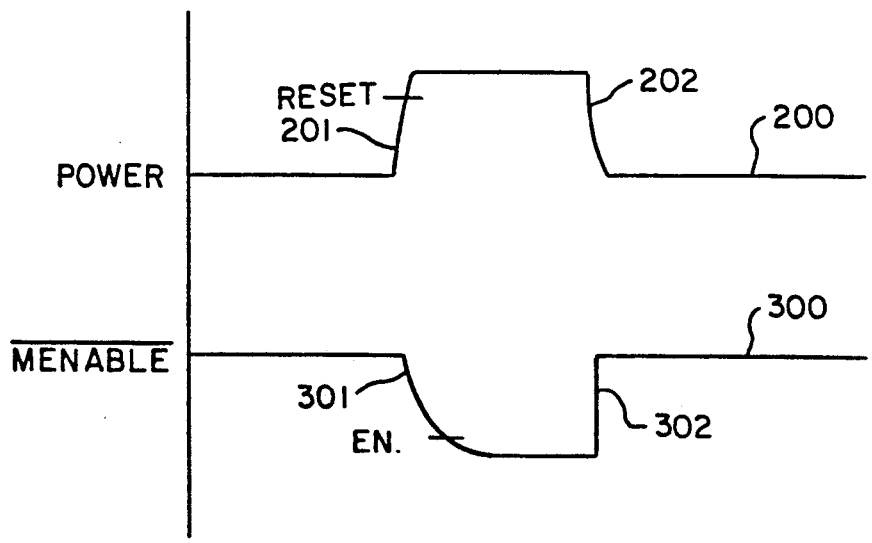
FIG. 8 is a chart used in explanation of part of the circuit of FIG. 5.

However, when power turns off at point 202 in FIG. 8, the rectifying optocoupler 141 will supply a charging current across line 143 which will rapidly charge the capacitor C1 as can be seen at point 302 on line FIG. 8. Thus, the static RAM will be disabled very rapidly when power is turned off from the transformer coupling device 121.

A variety of other circuits for protecting the data stored in the memory device 102 can be devised as suits the particular embodiment of the data card 40 chosen by the user.

Figure 6:
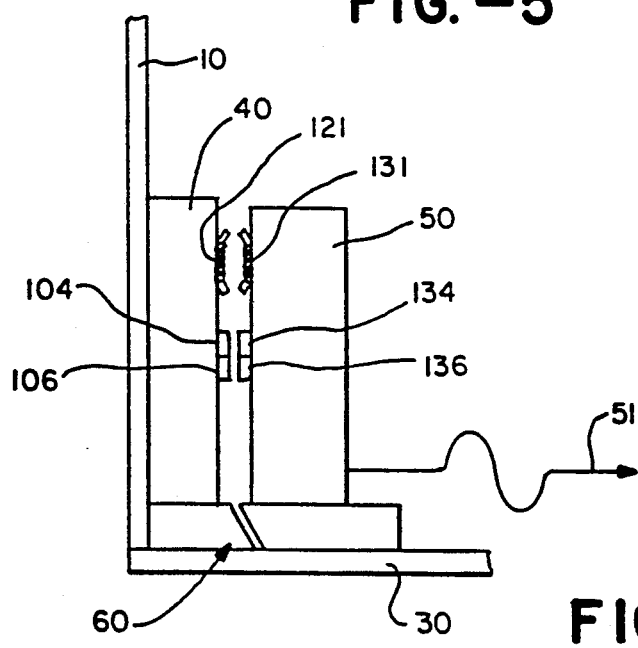
FIG. 6 is a schematic representation of the mounting relationship of apparatus according to the present invention.

FIG. 6 shows one configuration for mounting the data card 40, such as the one described with reference to FIGS. 4 and 5, in communication with the communication means 50 for receiving the data from the data card 40 and transmitting data to the data card 40. When the transportable container 10 is fully engaged on the engaging means 60 and mounted on the canopy 30 of the processing station, the data card 40 and the communicating means 50 are aligned for communication.

As mentioned with reference to FIG. 5, a transformer coupling device 121 is mounted on the data card 40. Likewise, a mate transformer coupling device 131 is mounted on the communicating means 50. When the transportable container 10 is engaged on the engaging means 60 fully, the transformer coupling device 121 and its mate 131 are aligned so power is transmitted from the communicating means 50 to the data card 40 on the transportable container 10.

Also shown in FIG. 6 schematically are the transmitting means 104 and the receiving means 106 on the card 40. Mounted adjacent the transmitting means 104 on the communicating means 50 when the transportable container 10 is fully engaged is a mate receiving means 134 for receiving the data from the data card 40. Also a transmitting means 136 is mounted on the communicating means 50 so that it is adjacent the receiving means 106 on the transportable container 10 when the transportable container 10 is fully engaged on the engaging means 60. The communicating means 50 communicates across the communication line 51 with the data processing means 20 on the processing station 100.

Figure 7:
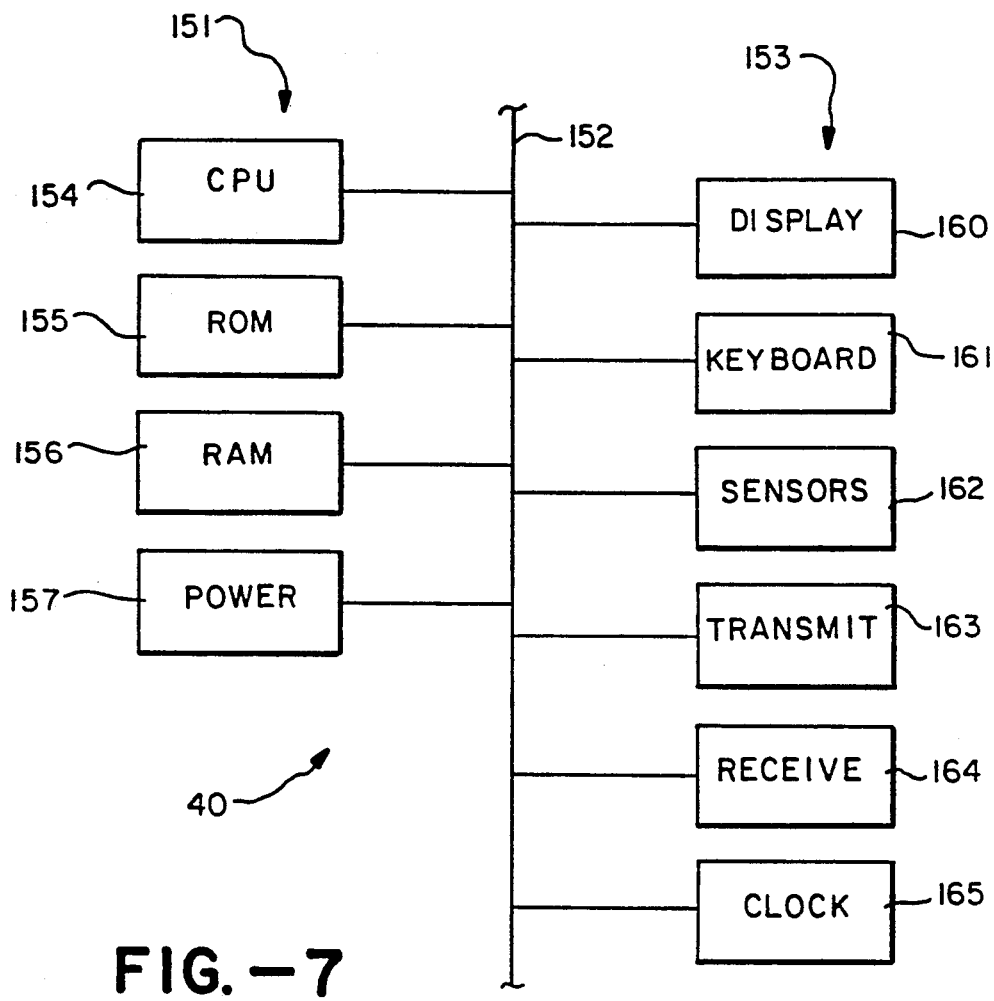
FIG. 7 is a block diagram of a system included on the transportable container in one embodiment of the present invention.

A preferred embodiment of the circuit mounted on the data card 40 is shown in FIG. 7. The data card 40 shown schematically in FIG. 7 includes a data processing system 151 in communication across a bus 152 with a plurality 153 of input/output devices.

The data processing system includes a CPU 154, a non-volatile memory device such as a ROM 155, a random access memory device 156 for reading and writing data, and a power supply 157 such as the power supply shown in FIG. 5.

The plurality of input/output devices include any one of the following devices. First, a display 160, such as an LED or liquid crystal display, may be mounted on the data card 40 for providing data to an operator. Also a keyboard 161 may be mounted on the data card 40 with the transportable container 10 so that an operator may control data stored within the data card 40.

A sensor device 162 may be included on the data card 40 which communicates with a plurality of sensors on the transportable container 10. These sensors may provide information regarding conditions, such as engagement or disengagement of the transportable container 10 with an engaging means 60, opening or closing of the port in the transportable container 10 for allowing access to the articles stored within a container or other conditions. Further, a sensor may be included which indicates whether a retaining device has engaged the articles stored in the container. Many other sensors may be included depending on the particular processing steps being carried out and the characteristics of articles being transported in the transportable container 10.

The plurality of input/output devices 153 includes a transmitter 163 and a receiver 164 such as the light emitting diode 44 and photosensitive transistor 52 discussed with reference to FIGS. 4 and 6. The transmitter 163 and receiver 164 may be of other varieties of phototransistors and photodetectors as suited to the particular use required. Further, the transmitter and receiver may be comprised of a magnetic tape and a magnetic reading head. Other acoustic, inductive or optical means of accomplishing data communication between the electronic data card 40 and the communication means 50 may be implemented as suits the particular needs of the device.

Further, the data card 40 may include a real time clock 165 for generating data regarding real time. Data from the clock 165 may be useful by the processing stations in determining parameters for processing and the like. Also, the clock 165 may be used for determining length of storage time for the articles contained in the transportable container 10.

DISTRIBUTED PROCESSING SYSTEM

In accordance with the present invention, the transportable container 10 with the data card 40 attached to it can be used in conjunction with a plurality of work stations, such as the work station 100 illustrated in FIG. 1, to form a novel distributed processing system. Once such distributed processing system is used to fabricate semiconductor integrated circuits. The fabrication of semiconductor integrated circuits typically involves the processing of semiconductor wafers using a variety of discrete processing operations using a corresponding variety of work stations.

For example, the processing operations and corresponding work stations involved in the fabrication of a semiconductor integrated circuit from a semiconductor wafer might include the following operations and work stations. A resist is applied to the wafer at a first work station. The thickness of the resist is measured at a second work station. A circuit pattern is exposed onto the resist at a third work station. The circuit pattern is developed at a fourth work station. The width of one or more circuit traces are measured at a fifth work station. Etching of the exposed resist is performed at a sixth work station. Those skilled in the art will appreciate that the exemplary processing steps and work stations just described are but a representative few of a large variety of possible processing steps and work stations.

In a given semiconductor integrated circuit processing environment, there may be a variety of batches of wafers simultaneously undergoing fabrication. Each batch may be enclosed within a different transportable container 10 or group of containers each with its own associated card 40. Furthermore, different batches of wafers may undergo different operations at different work stations so as to ultimately produce different types of semiconductor integrated circuits. Alternatively, different batches of semiconductor wafers may use the same work stations, but may be processed somewhat differently by the work stations so as to ultimately produce different types of semiconductor integrated circuits. For example, the resists of two batches of wafers both might be etched at the sixth work station, but one batch might be etched for a longer period of time than the other.

Additionally, the nature of the processing operations to be performed in the course of fabricating integrated circuits from a batch of wafers may depend upon the outcome of earlier processing steps. For example, the step of etching the exposed resist at the sixth work station may have an etch time which depends upon the width of the one or more circuit traces measured at the fifth work station. Therefore, the outcome of the circuit trace measurement is used to determined the etch time.

Consequently, there exists a need for a processing system such as that of the present invention for the control of complex processing operations like the manufacture of semiconductor integrated circuits.

Referring to the drawing of FIG. 1, it will be appreciated that the work station 100 is merely representative of a variety of work stations which can form part of a processing system in accordance with the present invention. Thus, although the processing system will be described with reference to the work station 100 shown in FIG. 1, it will be appreciated that the actual processing system includes a plurality of work stations for performing a variety of processing operations such as those discussed above; applying a resist, measuring resist thickness, exposing the resist, measuring the width of circuit traces, and etching the resist.

Referring once again to the illustrative drawings of FIG. 2, it can be seen that coupled to the local control, processor 20 (hereinafter "local" 20) is a local transfer control processor 300 and a local operation control processor 302. In operation, the local 20 is mounted on the work station 100 in electronic communication with the means 50 which serves as a two-way communication means with the data card 40. Referring to FIG. 4, the microcomputer 101 of the data card 40 can engage in two-way communication, through transmitter 104 and receiver 106, with means 50. Referring once again to FIG. 2, the local 20 is in electronic communication with local transfer control processor 300 and the local operation control processor 302.

The local transfer control processor 300 controls the operation of transfer means 304 which include arms 306 for transferring a cartridge 31 containing wafers 32 between the work station 100 and the transportable container 40. One embodiment of the preferred transfer means 304 is described in commonly assigned allowed and co-pending patent application Ser. No. 769,709, filed Aug. 26, 1985, entitled "LONG ARM MANIPULATOR FOR SEALED STANDARD INTERFACE APPARATUS", U.S. Pat. No. 4,676,709. An alternative embodiment of the transfer means 304 is described in commonly assigned allowed and co-pending patent application Ser. No. 769,850, filed Aug. 26, 1985, entitled "SHORT ARM MANIPULATOR FOR SEALED STANDARD MECHANICAL INTERFACE APPARATUS", U.S. Pat. No. 4,674,936. These two patent applications are hereby incorporated herein by this reference.

The local operation control processor 302 controls the operation of the work station 100. As explained above, work station 100 is shown for purposes of example only. Any number of a variety of different types of work stations performing a corresponding variety of processing operations can be included in the processing system.

Figure 9A:
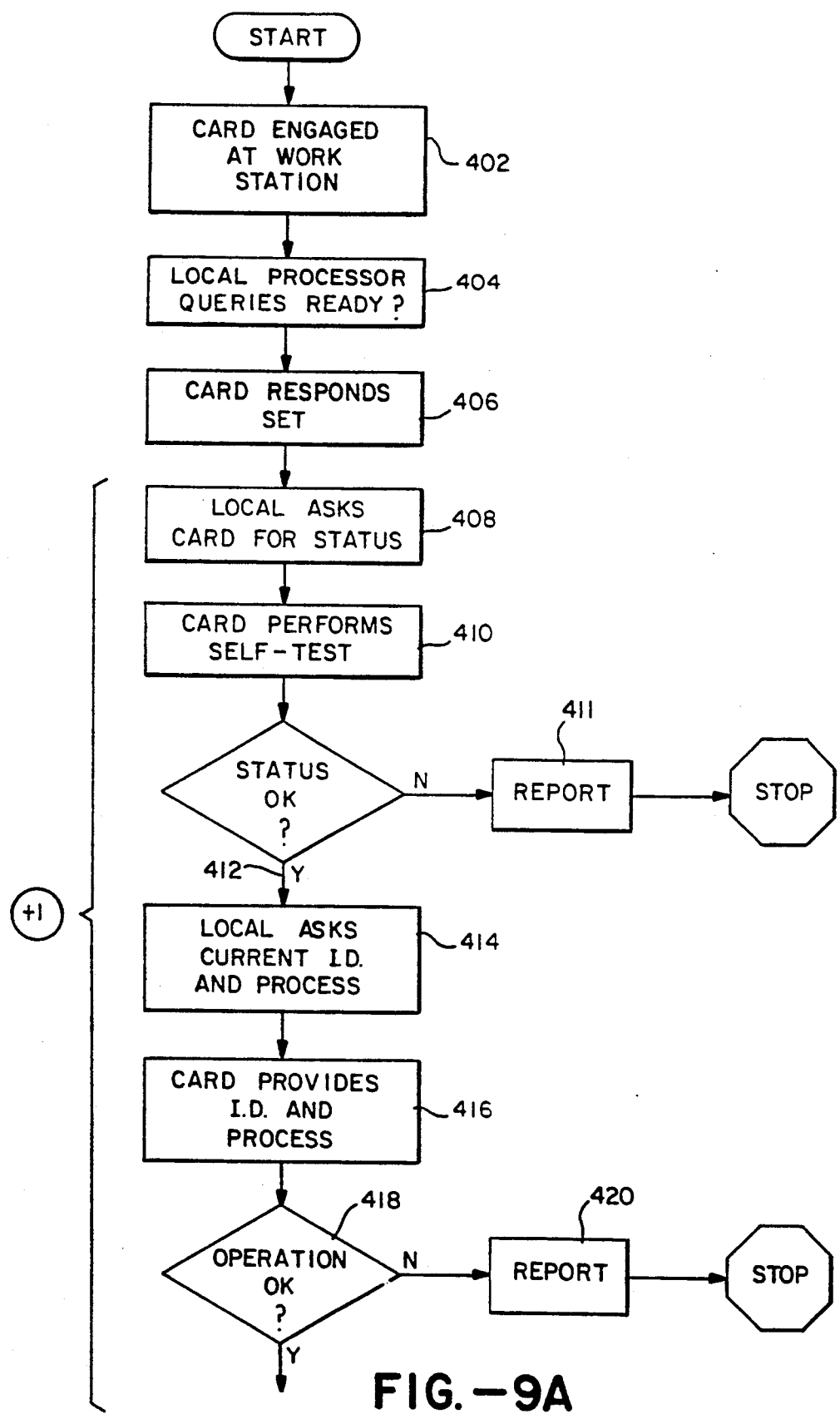
Figure 9B:
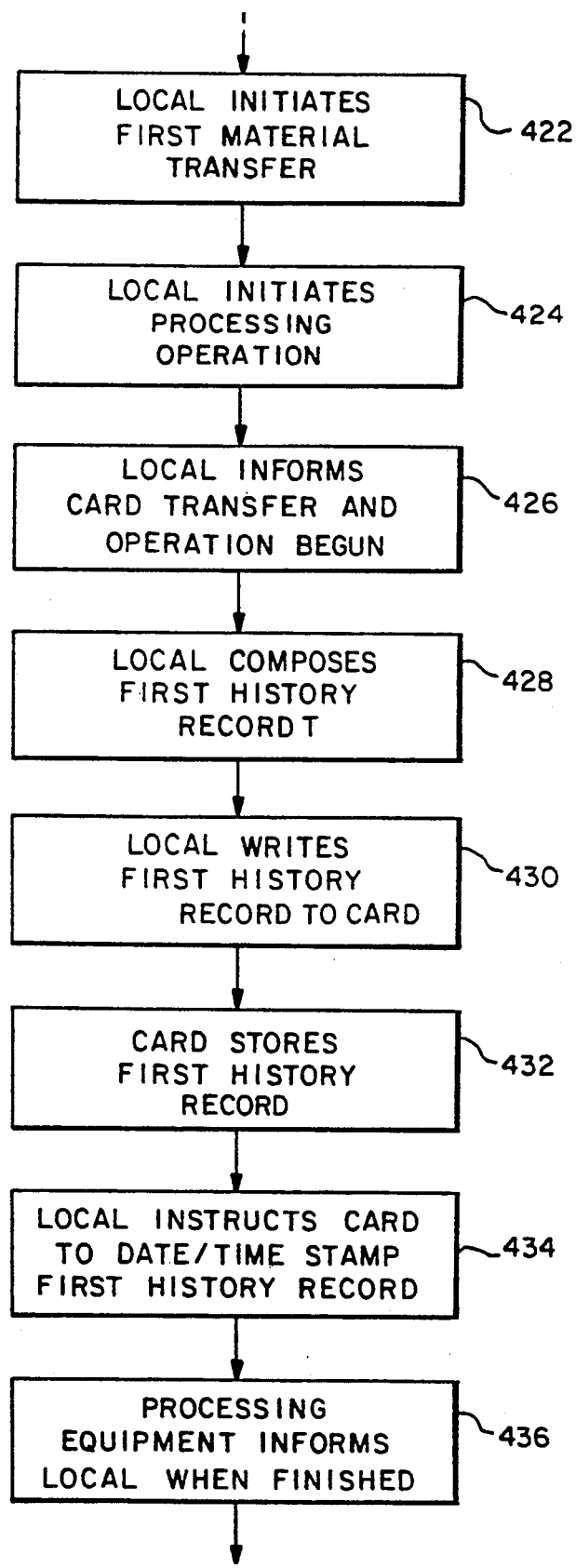
Figure 10:
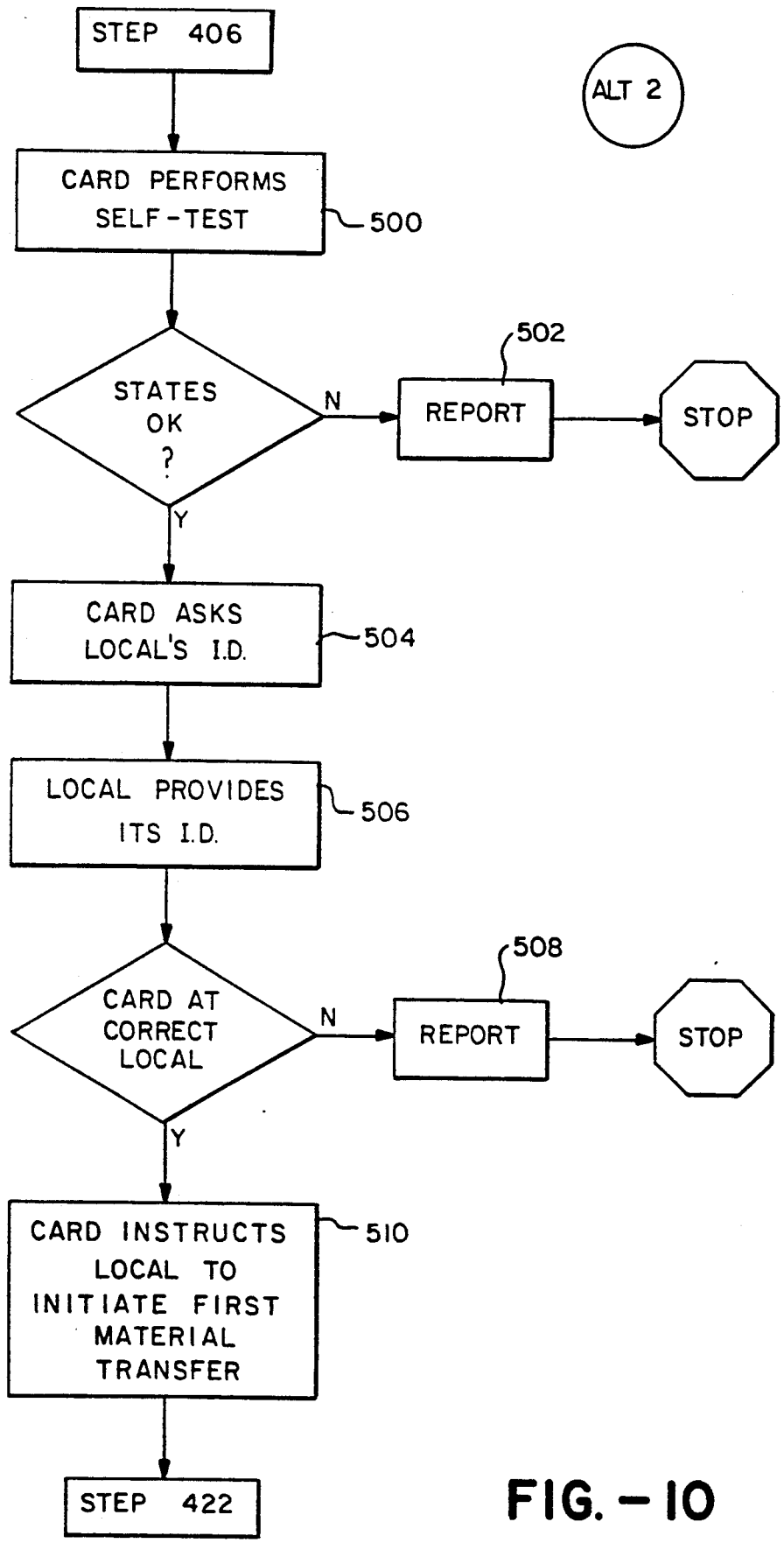
FIG. 10 is an alternative flow chart for substitution for a portion of the flow chart of FIG. 9.

The system will be explained with reference to an exemplary manufacturing operation and with particular reference to the fabrication of semiconductor integrated circuits, but it should be appreciated that the system is applicable to other operations as well. The flow charts of FIGS. 9 and 10 illustrate the novel distributed control aspects of the system. Distributed control is an important feature of the system of the present invention which must be flexible enough to efficiently select among a variety of processing steps and work stations.

As explained above with reference to FIG. 1, a transportable container 10 with its attached data card 40 is transported to a work station, for example, by a human operator. Referring now to FIGS. 1 and 9A-9C, after the container 10 is engaged to the work station 100, indicated as step 402 in the flow chart of FIGS. 9A-9C, the local 20 querries the data card 40 as to whether it is ready to exchange digital information, step 404. The data card 40 responds with a digital message generated by its microcomputer 101 (see FIG. 4) that it is set to exchange digital information, step 406.

The local 20 instructs the data card 40 to report its status, step 408. In response, the microcomputer 101 of the data card 40 performs a self-test, step 410. The self-test, for example, may include a test to determined whether the card's battery 125 and RAM 102 are in proper working order. If the self-test determines that the card is not in proper working order, then the microcomputer 101 causes a signal to appear on the card display 21 indicating that the card 40 may not be operating properly, step 411, and digital communication between card 40 and the local 20 typically stops. If, however, the self-test shows the card 40 to be operating properly, then the card 40 reports that the procedure may continue, step 412.

The local 20 then requests that the card 40 identify itself and provide the current processing data, step 414. In response, the card 40 provides an identifying code. In a semiconductor integrated circuit manufacturing processing system, the card might also identify the lot number of the semiconductor wafers to be processed as well as the identity of the work station which is to perform the next processing step and a specification of what processing step is to be performed next, step 416. For example, the next processing step might be the exposing of a circuit pattern onto a resist at the third work station. The local 20 determines whether the container 10 with its contents and its card 40 is at the correct work station to perform the next processing step, step 418. If it is not, then it informs the data card 40 which reports via display 21 that the container 10 is at the wrong work station, step 420, and typically digital communication between the card 40 and the local 20 stops. If the local 20 determines that the card 40 is at the correct work station, then digital communication continues between the card 40 and the local 20.

The local 20 responds by instructing the local transfer control processor 300 to cause the transfer of articles to be processed from the transportable container 10 to the work station 100, step 422. For example, in semiconductor integrated circuit fabrication, a cartridge 31 containing wafers 32 to be processed is lowered from the container 10 to the work station 100 via arms 306.

Next, the local 20, instructs the local operation control processor 302 to initiate the processing operation, step 424. For example, the processing operation to be performed by the work station might be to expose a circuit pattern onto a resist applied to a semiconductor wafer.

The local 20 informs the card that the transfer has been completed and that the processing operation has been commenced, step 426. The local 20 composes a first history record identifying the work station and indicating that the transfer has occurred and that the processing operation was commenced, step 428. The local 20 communicates the first history record to the card 40, step 430. The card 40 stores first history record, step 432. The local 20 instructs the card 40 to date and time stamp the first history record; using its microcomputer 101 and real-time clock 165 (FIG. 7); the card 40 complies with the instruction and records a date and time record for the first history record, step 434.

Upon completion of the processing operation, the local operation control processor 302 informs the local 20 of its completion, step 436. The local 20 instructs the local transfer control processor 300 to initiate a transfer of the articles processed, the semiconductor wafers 32 for example, from the work station 100 back to the transportable container 10, step 438.

The local composes a second history record, step 440. The second history record, for example, provides a record of the operation of exposing a circuit pattern onto a resist applied to a semiconductor wafer. The local 20 communicates the second history record to the card 40, step 442, and instructs the card 40 to date, time stamp and store the second history record, step 444.

The local 20 instructs the card 40 to advance to the next processing step, step 446. In response, the card 40, prepares for the next processing step, step 448, for example by changing the identity of the work station and process to be identified in step 416 at the next work station. Finally, the card 40 causes its display 21 to identify for the operator the next work station to be visited by the transportable container, step 450.

Two examples which follow illustrate the significance of including a microcomputer 101 on the card 40.

The first example will be explained with reference to FIG. 10 in which there is shown an alternative flow chart path which can be substituted for steps 408-420 of the flow chart of FIG. 9A. In the alternative flow chart, following step 406, explained above, the card 40 itself initiates and performs the self test, step 500, described above with respect to step 410. If the card 40 determines that it is not operating properly then it causes its display 21 to report its inoperability, step 502, and communication with the local 20 typically stops. On the other hand, if the card 40 determines that it is operating properly, then the card 40 requests that the local 20 report its identity, step 504. In response, the local 20 identifies itself to the card 40, step 506. The card 40 then determines whether it is the correct work station. If it is not, it causes the display 21 to display an appropriate message, step 508, and communication with the local 20 typically stops. If the card 40 determines that it is in fact at the correct work station, then the card 40 instructs the local 20 to initate the first material transfer, step 510.

Figure 11:
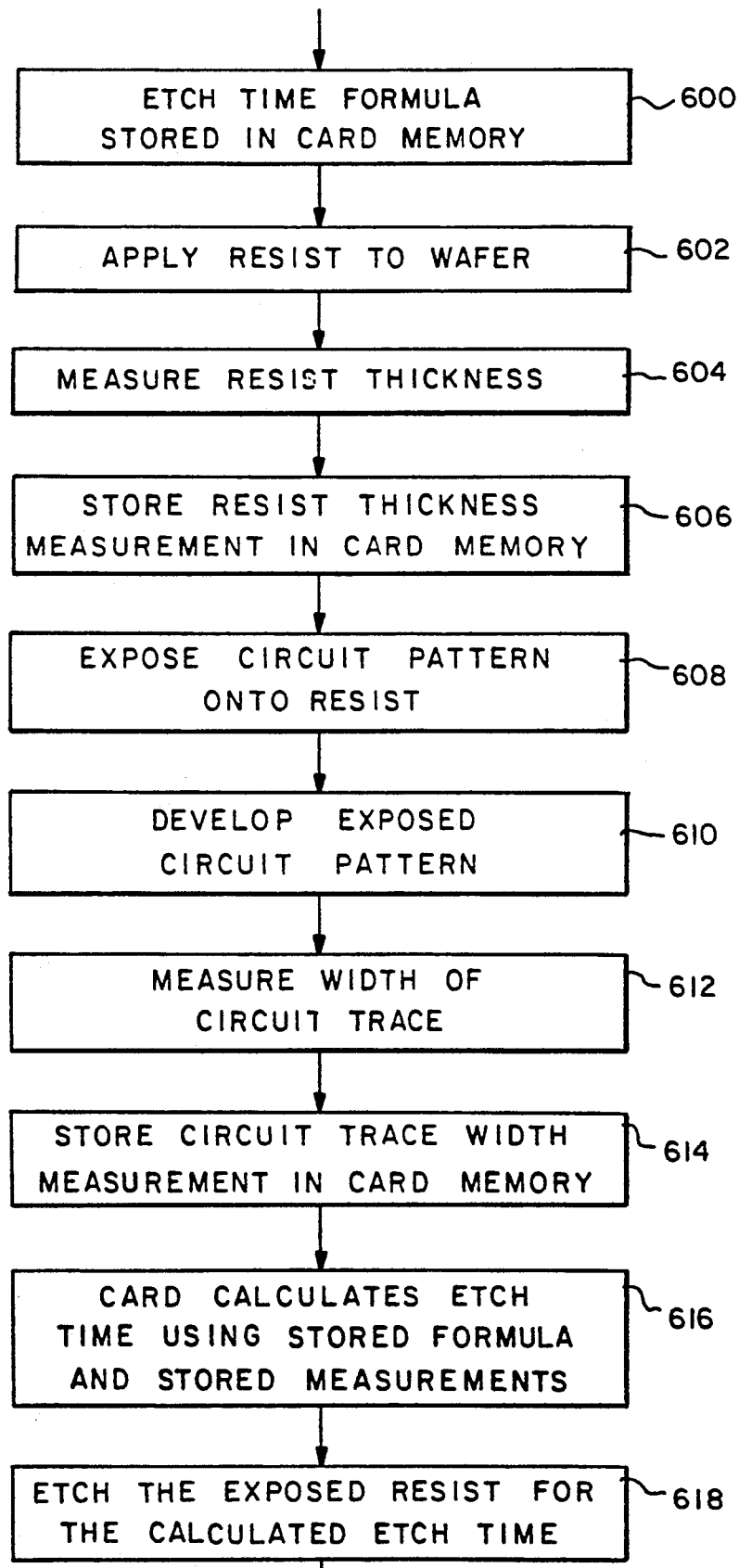
FIG. 11 is a flow chart used in the explanation of the processing system in accordance with the present invention.

The second example will be explained with reference to the flow chart of FIG. 11 in which a representative series of card operations and work station operations from an exemplary semiconductor integrated circuit fabrication process are shown. For the purposes of this example, the card 40 is assumed to have stored in its RAM 102 a formula for calculating etch time; step 600 represents the storage of the formula. The formula, for example, might be: K+A (width specified−width measured)+B (resist thickness). Where K, A and B are constant values, and the "width specified" refers to the specified width of a circuit trace, and "width measured" refers to the measure width of the circuit trace, and "resist thickness" is the measured thickness of a resist applied to a semiconductor wafer.

The first processing step is to apply a resist to semiconductor wafers being processed, step 602. This step, for example, is performed at a first work station. The thickness of the resist is measured at a second work station, step 604, and the measured thickness is stored in the card's RAM 102, step 606. A circuit pattern is exposed onto the resist at a third work station, step 608. The circuit pattern is developed at a fourth work station, step 610. The width of one or more circuit traces are measured at a fifth work station, step 612, and the measured width is stored in the card's RAM 102, step 614. The card 40, using its microcomputer 101, calculates the etch time, step 616, using the formula stored in step 600 and the measurements stored in steps 606 and 614. The exposed resist is etched for the calculated etch time, step 618.

From the preceding two examples, it will be appreciated that the card 40 advantageously can be used as part of a distributed processing system which does not require centralized control. Instead, a card 40 associated with a transportable container 10 containing articles to be processed can store processing data pertaining to the particular articles, and can perform calculations necessary to properly process the articles.

INVENTORY MANAGEMENT SYSTEM

The present invention also provides a novel inventory management system which advantageously can monitor the status of articles, such as semiconductor wafers for example, between processing operations.

Referring to the illustrative drawings of FIG. 12, there is shown a tray 630 including a recessed region 632 sized to receive a transportable container 10 having a data card 40 mounted on it as shown. The tray 630 includes a two-way communication means 50-1 like the two-way communication means 50 described above and mounted on the work station 100.

As illustrated by the dashed lines 634, the base portion 636 of the transportable container 10 can fit snuggly within the recessed region 632. When the transportable container 10 is received within the recessed region 632, the card 40 is aligned with the two-way communication means 50-1 such that the card 40 and the means 50-1 can engage in two-way communication with each other.

Referring now to the illustrative drawings of FIG. 13, there is shown in block diagram form an inventory management system 637 which includes a plurality of trays divided into respective groups of trays 630-1 through 630-N. Each respective individual tray is like that described with reference to FIG. 12. Each tray in the respective groups of trays 630-1 through 630-N is coupled by a respective control line 639-1 through 639-N to a multiplexer circuit 640-1 through 640-N. The respective multiplexers 640-1 through 640-N are coupled via control line 642, which for example can be an RS232 C line, to a central control processor 644.

In the presently preferred embodiment, the central control processor 644 comprises an IBM compatible personal computer. The multiplexers 630-1 through 630-N are coupled to one another in a daisey chain such that signals propagated along control line 642 proceed in a serial fashion from one multiplexer circuit to another. Although only two groups of trays 630-1 and 630-N are shown together with two associated multiplexer circuits 638-1 through 638-N, it will be appreciated that a plurality of groups of trays and a corresponding plurality of groups of multiplexers can be included in the inventory management system 637.

In operation, a plurality of transportable containers 10 can be placed into the respective trays 630-1 through 630-N of the inventory management system 637. An operator can use the central control processor to ascertain, for example, the processing status of the contents of any container 10 received within any of the trays of the system 637.

More particularly, for example, in order to obtain information regarding the contents of the container 10 shown in FIG. 12, the central control processor 644 instructs the respective multiplexer circuit (not shown) coupled to that tray 630 to select that tray 630 and to couple it to the processor 644. The central control processor 644 sends digital signals to the selected tray 630 which cause two-way communication between the tray-mounted two-way communication means 50-1 and the card 40. Through the two-way communication, the central control processor 644, for example, can ascertain the contents of the container 10, the processing steps already performed on those contents and what processing steps are scheduled to be performed in the future. Additionally, through such two-way communication, the central control processor 644 can be used to reprogram the microcomputer 101 of the card 40, for example, so as to modify processing instructions stored in the card's RAM 102 or to update or correct its real time clock.

Thus, it will be appreciated that the present inventory management system 637 advantageously can distribute, for example, the task of maintaining a history of the processing steps and a schedule of future processing steps for the articles within respective transportable containers 10. Consequently, the central control processor 644 is free from maintaining and managing such information.

The foregoing description of a preferred embodiment of the invention has been presented for the purposes of illustration and description. It is not intended to be exhaustive or to limit the invention to the precise form disclosed, and obviously, many modifications and variations are possible in light of the above teaching. The particular embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A processing system comprising:
   (1) at least one transportable container for transporting articles to be processed;
   (2) first two-way communication means mounted on said at least one transportable container;
   (3) first microcomputer means mounted on said at least one transportable container for receiving and processing digital information communicated with said first two-way communication means;
   (4) storage means mounted on said at least one transportable container for storing digital information processed by said microcomputer means; and
   (5) a plurality of work stations each respectively adapted to having said at least one transportable container removably mounted thereon and each respectively including mounted thereon,
      (a) respective second two-way communication means adapted for two-way communication with said at least one transportable container when said container is mounted on the respective work station therewith, and
      (b) respective second microcomputer means for receiving and processing digital information communicated with said respective second two-way communication means mounted on the respective work station therewith.

2. An inventory management system comprising:
   (1) At least one transportable container for transporting articles, said at least one container including mounted thereon,
      (a) first two-way communication means, (b) first microcomputer means for receiving and processing digital information communicated with said first two-way communication means, and (c) storage means for storing digital information processed by said microcomputer means;

(2) a plurality of respective sensing means for sensing the presence of said at least one transportable container, each respective sensing means including respective second two-way communication means adapted for two-way communication with said first two-way communication means;

(3) selection means for selecting between respective sensor means of said plurality;

(4) central processor means coupled to said selection means for receiving digital information from and for providing digital information to respective two-way communication means of respective sensor means of said plurality.

3. The system of claim 2 wherein each respective sensing means of said plurality further includes respective receptacle means for receiving said at least one transportable container; and wherein two-way communication between said first two-way communication means and respective second two-way communication means can occur only when said at least one transportable container is received by said receptacle means.

4. The system of claim 3 wherein each respective receptacle means comprises at least one respective tray sized to receive said at least one transportable container; and wherein respective second two-way communication means are respectively mounted on respective trays.

5. The system of claim 2 wherein said selection means comprises a plurality of respective selection circuits each respectively coupled to at least one respective group of respective sensor means from said plurality.

6. The system of claim 5 wherein each respective selection circuit is adapted to selectively couple to said central processor means any one respective sensing means of a respective group coupled thereto.

7. The system of claim 6 wherein each respective selection circuit comprises a multiplexor circuit.

8. The system of claim 5 wherein said respective selection circuits are coupled to one-another and to said central processor means such that said respective selection circuits form a hierarchy in which signals communicated between said respective central processor and said respective selection circuits respectively proceed serially between said respective selection circuits.

9. The systems of claims 1 or 2, wherein:

said first and each respective second two-way communications means include means for inductive transmission and reception of data.

10. The systems of claims 1 or 2 wherein:

said first and each respective second two-way communications means include means for acoustic transmission and reception of data.

11. The systems of claims 1 or 2, further including:

a clock, mounted on said at least one transportable container for generating real time data.

12. The systems of claims 1 or 2 further including:

display means, mounted on said at least one transportable container, for displaying data from said first microcomputer means.

13. The systems of claims 1 or 2 further including:

sensor means, mounted in communication with said first microprocessor means, for sensing a condition of said at least one transportable container.

14. The systems of claims 1 or 2, wherein:

said first and each respective second two-way communication means include means for optical transmission and reception of data.

15. A system for storing and transporting semiconductor wafers, comprising:

a transportable container, said transportable container having an interior region adapted to receive a plurality of semiconductor wafers and a locking mechanism for controlling access to said interior region;

a workstation for receiving said transportable container and for operating said locking mechanism;

data storage means provided on said transportable container for storing information related to said semiconductor wafers in said transportable container;

control means, provided on said workstation and responsive to said information stored by said data storage means, for storing information related to the identify of said workstation and the status of said workstation, comparing the information related to each semiconductor wafer and the identity of said workstation, for controlling said workstation to operate said locking mechanism in accordance with the status of said workstation and in accordance with said comparison, and for controlling said workstation to process selected ones of said semiconductor wafers.

16. A system according to claim 15, wherein:

said system comprises a plurality of said workstations; and said control means provided on each said workstation is for transmitting information related to the processing performed by the workstation to said data storage means.

17. A system according to claim 16, wherein said interior region of said transportable container is isolated from ambient atmospheric conditions by said locking mechanism.

18. A system according to claim 15, further comprising:

a storage station for receiving said transportable container; and communication means, provided on said storage station and responsive to said information stored by said data storage means, for updating said information stored by said data storage means.

* * * * *